United States Patent
Mullane et al.

(10) Patent No.: US 7,649,917 B2
(45) Date of Patent: Jan. 19, 2010

(54) METHOD AND SYSTEM FOR CONTINUOUS SWEEPING OF A TUNABLE LASER

(75) Inventors: Tommy Mullane, Park West Business Park (IE); David McDonald, Park West Business Park (IE); Thomas Farrell, Park West Business Park (IE); Ciaran Polley, Park West Business Park (IE); Peter B. O'Connor, Park West Business Park (IE)

(73) Assignee: Intune Technologies Limited (IE)

( * ) Notice: Subject to any disclaimer, the term of this patent is extended or adjusted under 35 U.S.C. 154(b) by 400 days.

(21) Appl. No.: 10/552,967

(22) PCT Filed: Apr. 14, 2004

(86) PCT No.: PCT/IE2004/000056
§ 371 (c)(1),
(2), (4) Date: Sep. 1, 2006

(87) PCT Pub. No.: WO2004/091059
PCT Pub. Date: Oct. 21, 2004

(65) Prior Publication Data
US 2007/0183465 A1 Aug. 9, 2007

(30) Foreign Application Priority Data
Apr. 14, 2003 (IE) ................. S2003/0281

(51) Int. Cl.
*H01S 3/10* (2006.01)

(52) U.S. Cl. .............. 372/20; 372/24; 372/29.01; 372/29.011

(58) Field of Classification Search ............ 372/20, 372/24, 29.01, 29.011
See application file for complete search history.

(56) References Cited

U.S. PATENT DOCUMENTS

| 6,504,856 B1 | 1/2003 | Broberg et al. ........... 372/38.07 |
| 6,535,532 B1* | 3/2003 | Ackerman et al. .......... 372/32 |
| 2003/0007522 A1* | 1/2003 | Li et al. .................. 372/20 |

FOREIGN PATENT DOCUMENTS

WO   WO 03/023916 A1   3/2003

OTHER PUBLICATIONS

B. Glance et al., "One-THz Digital Random Access High Resolution Optical Frequency Synthesizer Providing Cold-Start Operation From A Frequency Reference," Communications: Connecting the Future. San Diego, Dec. 2-5, 1990, Proceedings of the Global Telecommunications Conference and Exhibition, New York, IEEE, vol. 2, Dec. 2, 1990 (1990-12-0Z), p.*

(Continued)

*Primary Examiner*—Minsun Harvey
*Assistant Examiner*—Xnning Niu
(74) *Attorney, Agent, or Firm*—McDonnell Boehnen Hulbert & Berghoff LLP

(57) ABSTRACT

The invention relates to a method and system for providing a set of continuous tuning regions from a discontinuously tuned laser, by providing a wavelength reference having at least first and second resonance peaks, sweeping the laser across a pre-determined wavelength range of the wavelength reference, and defining, within the laser sweep, one or more regions of continuous tuning operation of the laser, each of the regions corresponding to a response of the laser between adjacent resonance peaks of the wavelength reference. The advantage of the invention is that it provides a way for stitching together continuous regions of a multi-section tunable laser in an efficient and accurate manner.

17 Claims, 6 Drawing Sheets

OTHER PUBLICATIONS

Glance B., et al. "One-THZ Digital Random Access High Resolution Optical Frequency Synthesizer Providing Cold-Start Operation from a Frequency Reference", Communications: Connecting the Future. San Diego, Dec. 2-5, 1990, Proceedings of the Global Telecommunications Conference and Exhibition (Globecom), New York, IEEE, US, vol. 2, Dec. 2, 1990, pp. 766-767, XP000220883, ISBN: 0-87942-632.

Sarlet, G., et al. "Control of Widely Tunable SSG-DBR Lasers for Dense Wavelength Division Multiplexing", Journal of Lightwave Technology, IEEE. New York, US., vol. 18, No. 8, Aug. 2000, pp. 1128-1138, XP000989390, ISSN: 0733-8724.

Upschulte et al., "Measurements of CO, $CO_2$, OH, and $H_2O$ in Room-Temperature and Combustion Gases by Use of a Broadly Current-Tuned Multisection InGaAsP Diode Laser," Applied Optics, vol. 38, No. 9, Mar. 20, 1999, pp. 1506-1512.

Farrell, T. et al., "Complete Wavelength Control of GCSR Lasers Over EDFA Band", IEEE LEOS' 99, San Francisco, Nov. 1999.

International Search Report PCT/IE2004/000056 mailed Dec. 21, 2004.

* cited by examiner

METHOD AND SYSTEM FOR CONTINUOUS SWEEPING OF A TUNABLE LASER

FIELD OF THE INVENTION

This invention relates to tunable lasers and the requirement to sweep a range of wavelengths in a continuous manner. This invention specifically relates to a method and system to stitch two or more continuous tuning regions of the laser together. Within the present specification the term "continuous sweeping" means that there are no discernable glitches or jumps in the output frequency of the device outside of the smooth sweep across the wavelength range of interest.

BACKGROUND TO THE INVENTION

Multi section laser diodes are well known in the art and can be switched between different wavelengths. Typically, the diode is calibrated at manufacture to determine the correct controls that should be applied so as to effect the desired output frequencies from the laser.

One of the first known multi-section laser diodes is a three-section tunable distributed Bragg reflector (DBR) laser. Other types of multi-section diode lasers are the sampled grating DBR (SG-DBR), the superstructure sampled DBR (SSG-DBR) and the grating assisted coupler with rear sampled or superstructure grating reflector (GCSR). There are also other laser types such as the External Cavity Laser (ECL) and gas lasers. A review of such lasers is given in Jens Buus, Markus Christian Amann, "*Tunable Laser Diodes*" Artect House, 1998 and "*Widely Tunable Semiconductor Lasers*" ECOC'00. Beck Mason.

FIG. 1 is a schematic drawing of a DBR 10. The laser comprises of a Bragg reflector sections 2 with a gain or active section 6 and phase section 4. An anti-reflection coating 9 is sometimes provided on the front and/or rear facets of the chip to avoid facet modes. The Bragg reflector takes the form of Bragg gratings 5. The pitch of the gratings of the Bragg reflector varies slightly to provide a Bragg mode which moves in frequency through varying the current supplied to this sections. The optical path length of the cavity can also be tuned with the phase section, for example by refractive index changes induced by varying the carrier density in this section. A more detailed description of the DBR and other tunable multi-section diode lasers can be found elsewhere Jens Buus, Markus Christian Amann, "*Tunable Laser Diodes*" Artect House, 1998.

As detailed above such tunable semiconductor lasers contain sections where current is injected to control the output frequency, mode purity and power characteristics of the device. Various applications in telecommunications/sensor fields require the laser to sweep across a particular wavelength range in as continuous a manner as possible. Moreover many applications require that the range in wavelength that is to be swept to be quite large, up to 80 mm and higher. However a problem with this approach is that certain types of tunable lasers have only a set of narrow ranges of wavelengths over which they can be continuously tuned. These individual continuously tunable regions when put end to end will cover the full sweep range of interest with some overlap.

It is known that lasers can be used to interrogate sensors such as Fibre Bragg Gratings (FBG) which is described in U.S. Pat. No. 5,401,956 and assigned to 'United Technologies Corporation'. This US patent provides a method of interrogation of a Fibre Bragg Gratings using a tunable laser where the laser is continuously tunable. While it is known that such a laser can be used in DBR or other similar devices a problem with this US patent is that the methodology described is not suitable for discontinuously electronically tunable lasers as it is not reliable and/or accurate for tuning of the laser.

It is desirable therefore to have a scheme by which each of these continuous regions can be seamlessly stitched together to give the appearance of continuous tuning, to overcome the above mentioned problems.

OBJECT OF THE INVENTION

The object of the present invention is to provide a method and system for stitching together continuous regions of a multi-section tunable laser in an efficient and accurate manner.

SUMMARY OF THE INVENTION

Accordingly the present invention, as set out in the appended claims, provides a method adapted to identify for a predetermined wavelength the end of a first continuously tunable region within the range of operation of the laser and thereafter to once again identify this same wavelength at the beginning of a second continuously tunable region with high accuracy.

Desirably the first and second continuously tunable regions are adjacent or overlap with one another. A control signal can then be provided to highlight the times when continuous tuning operation is being performed. By limiting a suitable receiver to only make measurements when the control signal is asserted, the method of the present invention provides for a high level of confidence in the continuous tuning behaviour in the measurements. The methodology and technique is generic to all types of laser devices and therefore can be applied to several different types of tunable laser such as ECL, DBR, SG-DBR, GCSR etc.

Desirably, once the first and second continuously tunable regions are identified, a method of stitching them together so as to form a usable tuning data set may be provided.

According to first embodiment of the present invention a method of providing a set of continuous tuning regions from a discontinuously tuned laser is provided, the method comprising the steps of:

provision of a wavelength reference having at least first and second resonance peaks, sweeping the laser across a pre-determined wavelength range of the wavelength reference, and defining, within the laser sweep, one or more regions of continuous tuning operation of the laser, each of the regions corresponding to a response of the laser between adjacent resonance peaks of the wavelength reference. Discontinuously electronically tunable laser is desirable to use in such an interrogation system and the present invention provides for a means to use such a laser in an interrogation system. In addition the present invention uses multiple wavelength references as an integral part of the system rather than a single wavelength reference to determine the wavelength of the laser at any given time during a wavelength sweep. The invention can also be employed in continuous tuning applications to provide more accurate and reliable tuning of the laser.

Desirably, the one or more regions of continuous tuning operation are adjacent to one another. Alternatively, the one or more regions of continuous tuning operation are displaced from one another across the pre-determined wavelength range. In such an alternative the regions may be chosen randomly within the pre-determined wavelength range.

The method may further comprise the step of:
stitching two or more regions to one another so as to form a usable tuning data set.

Such stitching the two or more regions to one another is desirably effected by:
a. creating a lookup table of regions that have continuous tuning over a first frequency region with a frequency overlap on either side with the previous and next continuous tuning regions,
b. asserting a control signal to denote a continuous region when the first resonance peak is detected,
c. de-asserting the control signal and jumping to the next continuous tuning region when the next resonance peak is found within this continuous tuning region, and
d. repeating the above steps (b-c) until a sufficient range of wavelength has been swept.

The regions of continuing tuning operation of the laser are desirably defined by:
calibrating the laser so as to provide a range of currents with no mode jumps,
selecting continuous regions with a first frequency overlap that have a resonance peak in the wavelength response from their beginnings and ends, and
setting the currents whilst sweeping through those wavelengths so as to provide a smoothly transitioning wavelength sweep.

The step of setting the currents is typically provided by filtering and/or shaping.

In preferred embodiments the method may include the additional step of assigning a frequency ($F_{meas}$) or wavelength ($\lambda_{meas}$) value to discrete points within the continuous region of operation of the laser device, the value being assigned by:
measuring the time from the resonance peak at the beginning of the sweep to the measurement instant ($T_{meas}$),
measuring the time required to sweep between adjacent resonance peaks ($T_{segment}$), and
calculating the value by extracting a value for $T_{meas}$ from $T_{segment}$ For application of a frequency value and using an etalon as a wavelength reference the method typically includes the step of calculating the frequency using the equation:

$$F_{meas} = FSR_{Etalon} * \frac{Tmeas}{Tsegment} + F_{SegmentStart},$$

where $FSR_{Etalon}$ is the free spectral range of the reference etalon and $F_{SegmentStart}$ is the absolute frequency of the first resonant etalon peak in the segment.

The laser device may be used as a reference source for a second device. Such an application may use the regions of continuous tuning operation to define the spectral characteristics of a second laser device, or to provide an optical spectrum analyser.

Ideally, there is provided the additional steps of measuring the output power of the laser and using this measurement to normalise the received DUT power.

The wavelength reference is desirably provided by one or more of the following:
a fabry perot etalon,
a gas cell,
fabry bragg grating,
notch filter,
a reflective fabry perot etalon, and
optical filter.

Any portion of the resonance peak may used to determine the location of the resonance peak.

Suitably the ambient temperature of the laser is measured, based on this measurement the temperature of the laser is adjusted to keep the laser chip at a constant temperature. This has the advantage of increasing the repeatability and robustness of the system in terms of the wavelength accuracy.

Ideally the temperature of the laser is controlled by carrying out one or more of the following steps:
a. Measuring the time to a resonance peak from the start of a continuous wavelength sweep
b. Comparing this time to an expected time
a. Adjusting the temperature of the laser based on the difference between the measured and expected times
b. Returning to step a Preferably the gain of the receiver is controlled dynamically from continuous tuning region to continuous tuning region. Ideally a delay is implemented between a control signal generated from the resonance peaks and a second control signal used to measure a DUT photodiode.

In another embodiment of the present invention there is provided a method of stitching two or more regions to one another so as to form a usable tuning data set for a tunable laser comprising the steps of:
a. creating a lookup table of regions that have continuous tuning over a first frequency region with a frequency overlap on either side with the previous and next continuous tuning regions;
b. asserting a control signal to denote a continuous region when a resonance peak is detected in the frequency region;
c. de-asserting the control signal and jumping to the next continuous tuning region when a next resonance peak is found within this continuous tuning region; and
d. repeating the above steps (b-c) until a sufficient range of wavelength has been swept.

The invention additionally provides a system adapted to provide a set of continuous tuning regions from a discontinuously tuned laser, the system comprising:
a wavelength reference having at least first and second resonance peaks associated therewith,
a tunable laser,
means for sweeping the laser across a pre-determined wavelength range of the wavelength reference, and
means for defining, within the laser sweep, one or more regions of continuous tuning operation of the laser, each of the regions corresponding to a response of the laser between adjacent resonance peaks of the wavelength reference.

There is also provided a computer program comprising program instructions for causing a computer program to carry out the above method which may be embodied on a record medium, carrier signal or read-only memory.

BRIEF DESCRIPTION OF THE DRAWINGS

These and other features of the present invention will be better understood with reference to the following drawings in which.

DETAILED DESCRIPTION OF THE DRAWINGS

The invention will now be described with reference to exemplary embodiments thereof and it will be appreciated that it is not intended to limit the application or methodology to any specific example. The techniques used by the method of the present invention are specifically provided to enable the formation of a continuous sweep from a discontinuously tuned laser. A continuous sweep is taken to be one which has no discernibly or substantial glitches in frequency along its length, only a smooth transition across the full wavelength range.

The methodology of the present invention will now be described with reference to a three section DBR device, and it will be appreciated from a person skilled in the art that this is only exemplary of the type of device that may be used with the method of the present invention. It will be further appreciated that the technique and methodology herein described is a generic technique being applicable to all narrow and widely tunable lasers such as the SG-DBR, SSG-DBR, DBR and GCSR types. Additionally numerous system arrangements can be employed to carry out the invention, as will be apparent from the following description.

Figure 1:
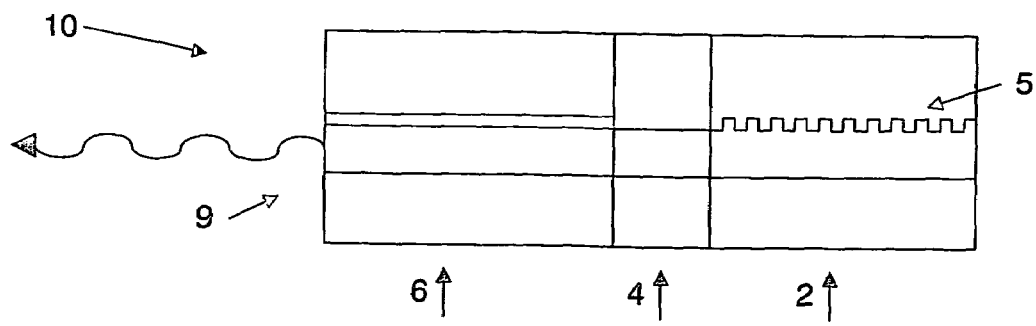
FIG. 1 shows a schematic of a Distributed Bragg Reflector Laser diode.
Figure 2:
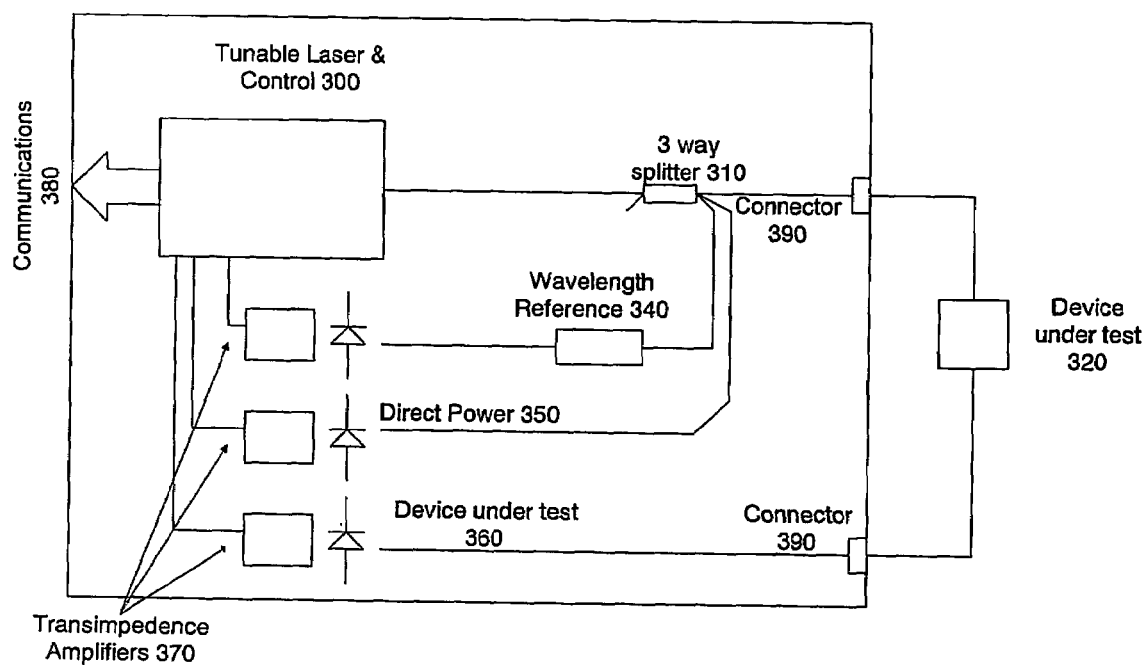
FIG. 2 shows a schematic of an embodiment of the system in a typical application.

FIG. 2 shows a typical embodiment of the system for a typical application, the system shown enabling the spectral characterisation of the device under test. A tunable laser and control electronics 300 provide the optical output where the output wavelength and power of the laser are controlled by the electronics. The optical power from the laser is passed through a 3-way splitter 310. Part of the light goes to a wavelength reference 340, a direct power measurement 350 and to a device under test (DUT) 320. Three receivers are provided (370) to monitor the wavelength reference power, direct power and the DUT power. These are typically measured with photo-detectors 331, a, b, c and a trans-impedance amplifier 332 a, b, c and the voltages are passed back to the laser and control electronics 300. Connector blocks or interface units 390 are also provided to enable the removable coupling of the DUT, one unit coupling it to the 3-way splitter and the second to the corresponding receiver 360 for the DUT. In operation such an embodiment of the invention provides for the analysis of the spectrum of the device under test by comparison with the control laser/wavelength reference combination.

This application to an accurate wavelength spectral characterisation is only one exemplary embodiment of the invention. Other embodiments may include the use of the methodology within an interrogator or optical spectrum analyser.

Figure 4:
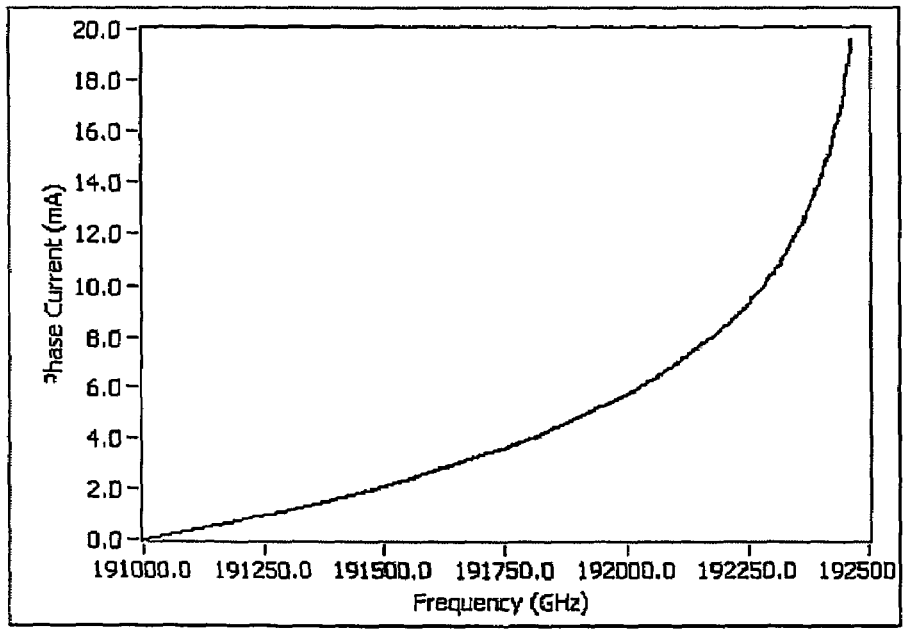
FIG. 4 is an example of the output of the high finesse etalon in one of the continuous sweep regions of the laser.
Figure 5:
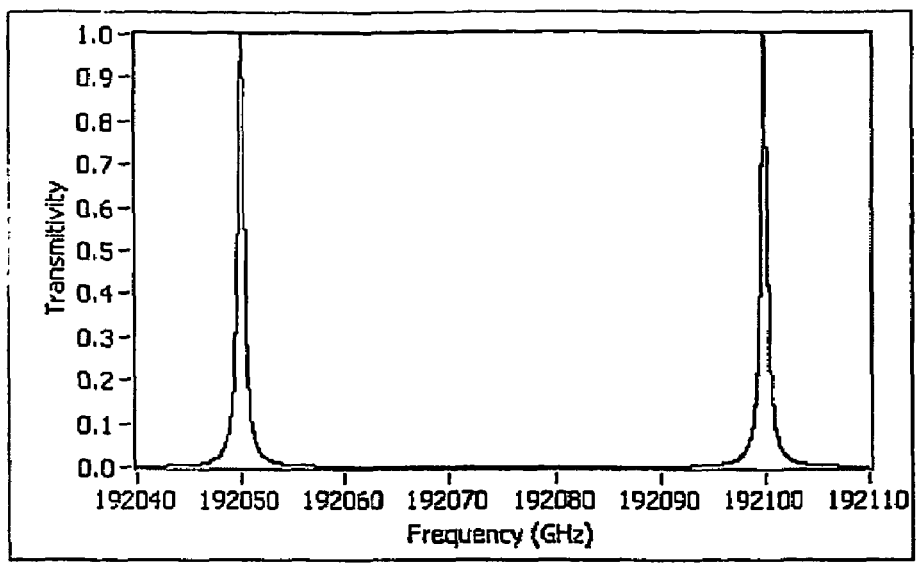
FIG. 5 is an example of the spectral characteristics of a fabry-perot filter as used in the methodology of the present invention.

To achieve the high accuracies required a wavelength reference is required that can be used in conjunction with the laser. In this exemplary technique, a Fabry Perot etalon is used but it will be appreciated that other references can be used which provide a similar characteristic. The Fabry Perot (FP) filter that is used desirably has a high Finesse (>30). A high finesse filter will be less dependent on output power variations of the tunable laser. The spectral characteristics of such a filter is shown in FIG. 4. It will be apparent, as shown in FIG. 5, that such a filter has at least two resonance peaks, each being associated with a high level of transmissivity at specific frequencies. The standard equation for the throughput of a fabry perot etalon is shown below, $$\frac{I_t}{I_i} = \frac{(1-R^2)}{(1-R)^2 + 4R\sin^2(\delta/2)}$$

Where $I_t$ is the transmitted light passed by the etalon, $I_i$ is the incident light to the etalon, R is the reflectivity of the mirrors and $\square$ is related to the distance between the mirrors. This function is cyclical in wavelength having a free spectral range of:

$$\frac{c}{2nl}$$

where c is the speed of light, n is the refractive index of the material in-between the mirrors. This means that the wavelength between two resonance peaks is the FSR of the etalon.

Between these peaks the filter exhibits low levels of transmissivity. This means that there is a large extinction ratio between the resonance peaks and away from the resonance peak. This also means that the spectral width of the filter is small (<5 pm). As the laser sweeps across the wavelength ranges, when the wavelength coincides with a resonance peak a response is obtained on a receiving photodiode. As the Free Spectral Range (FSR and the start frequency of the FP filter is well know and an approximate frequency of the laser is known (from, for example, an initial calibration of the laser) when the laser wavelength is at a resonance of the FP filter the wavelength of the laser can be determined very accurately (to much better than 0.1 pm resolutions). This enables high accuracy of the laser source to be determined at the wavelength reference peaks as the wavelength at each peak is known accurately, and the laser is calibrated so that in-between each resonance the wavelength tuning is linear in time, therefore the wavelength at any point between two such resonance's can be referenced from the time taken for the laser from the first resonance to the second resonance, i.e.

$\lambda_1$=Wavelength of the first resonance $\lambda_1$+FSR=wavelength of the second resonance T=time to sweep from $\lambda_1$ to the second resonance peak K=time to reach a wavelength between the two resonance's $\lambda$=wavelength at time K Therefore $\lambda = K/T * FSR + \lambda_1$ Note that the laser sweep has been linearised in order for this equation to be applicable.

Another example of a suitable wavelength reference would be a gas cell. It will be understood that a gas cell will provide a multitude of reference peaks to reference the tunable laser while sweeping, and while these peaks are not typically displaced regularly from one another, the use of such a cell is advantageous in that it is less susceptible to pressure or temperature effects and can therefore serve as a more accurate reference than for example the fabry-perot etalon. In a further example an etalon could be referenced to a gas cell, so as to provide an absolute reference and then the substantially regular intervals between the resonance peaks of the fabry-perot could be used in combination with the tunable laser in the method of the invention.

Figure 3:
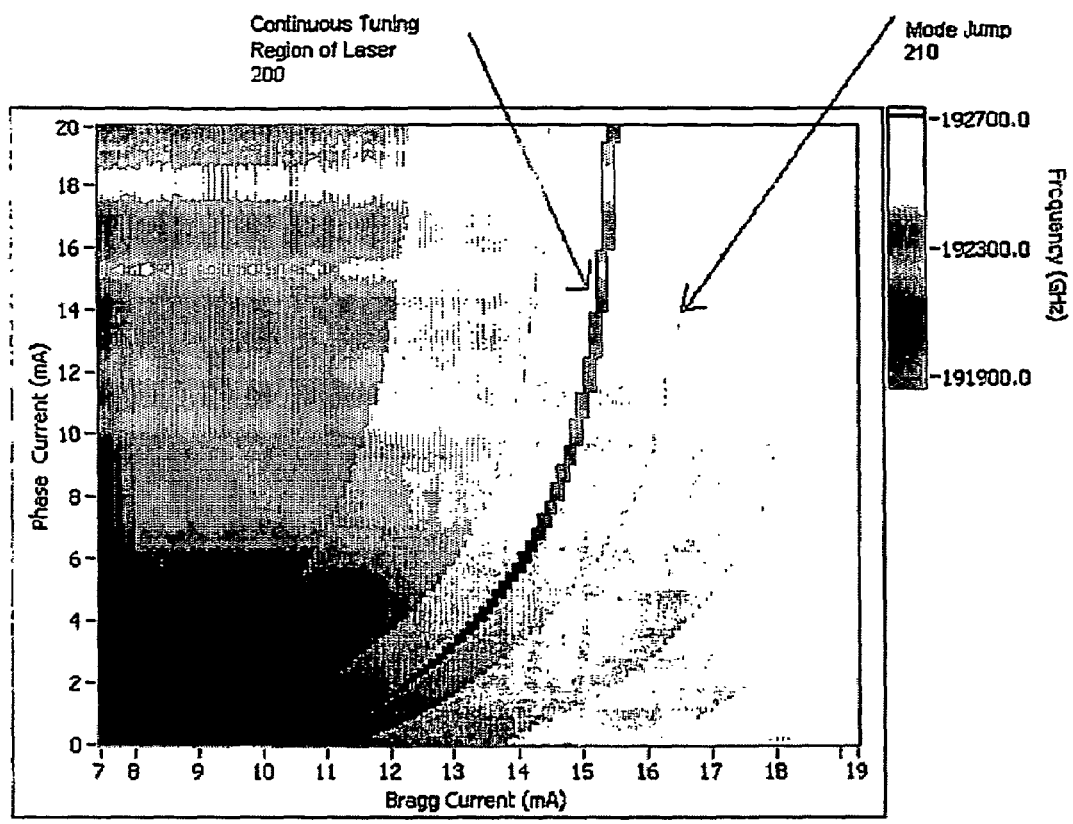
FIG. 3 shows how a continuous sweep may be obtained from a mode plane.

As can be seen from FIG. 3 a continuous tuning region is obtained by finding a line which crosses no mode boundaries 210. This is shown as a black line 200 in a phase, bragg plane, where the degree of shading denotes the output wavelength of the laser. By choosing a region to sweep the currents that do not cross a mode jump of the laser continuous tuning is achieved. This can be accomplished in a number of ways as reported in "*Complete Wavelength Control of a GCSR Laser over EDFA Band*" *IEEE LEOS*'99, San Francisco, November '99, T. Farrell et al. This results in a set of continuous tuning regions and a subset of these is taken which cover the wavelength range of interest.

FIG. 4 shows the current on the phase section of the laser vs. the output frequency of the laser. It will be appreciated that similar plots may be obtained for the other sections of the laser which must be controlled in a similar manner to achieve the continuous tuning. Specifically, a similar control current function is required for the Bragg section in the case of a 3 section DBR laser, and of the front and back reflector sections of the SG-DBR laser. If there is a requirement to keep the output power of the laser constant during the sweep the gain section can also be controlled to compensate. Use of a Digital to Analog Converter (DAC) which will step the currents at the required resolution, can be used to implement this, as will be appreciated by those skilled in the art. Also an electronic filter can be used to smooth the currents to achieve smooth continuous tuning of the laser source.

Once a series of these continuous sweeps has been identified, a set of continuous regions can be selected each of which overlap by a predetermined frequency, typically 10 GHz, and each of which starts and end 10 GHz from one of the peaks of the high finesse etalon. Each continuous tuning range of the laser will sweep the wavelength of the laser across two different peaks, so that all the continuous tuning ranges cover all the gaps between reference peaks in the wavelength range of interest. The laser may then be swept through each of these continuous regions. In operation, the wavelength reference of the filter is used to identify the regions of the sweep that are used. This is performed by using a control signal which is asserted when the sweep hits a first wavelength reference and de-asserted when the sweep hits a second reference. A control signal can be generated by use of a threshold operation on the response of the wavelength reference. When the light level is above a threshold value, this signifies that the wavelength of the laser is at the wavelength reference wavelength of that peak. This can be implemented with the use of a comparator and some simple logic elements. A reference is identified when the optical power received through the reference is above a threshold. This is explained in more detail in the following sections.

When sweeping the laser across one continuous tuning region the sweep will cross two wavelength reference peaks, equivalent to the two peaks of the etalon. Upon the wavelength of the laser hitting the first wavelength reference peak the control signal is asserted. This means that the laser is now sweeping linearly across a wavelength range between two reference wavelengths. Upon hitting the second etalon peak in this continuous sweep it de-asserts the control signal associated with the continuous regions of the sweep and starts sweeping along the beginning of the overlapping region of the next continuous region. Then the next continuous wavelength tuning region is used. During this sweep it once again detects the peak of the wavelength reference it will know it is at exactly the same frequency as the end of the last sweep and can reassert the control signal thereby providing seamless continuity in the tuning with no gaps or overlaps in wavelength in the measurements.

Figure 6:
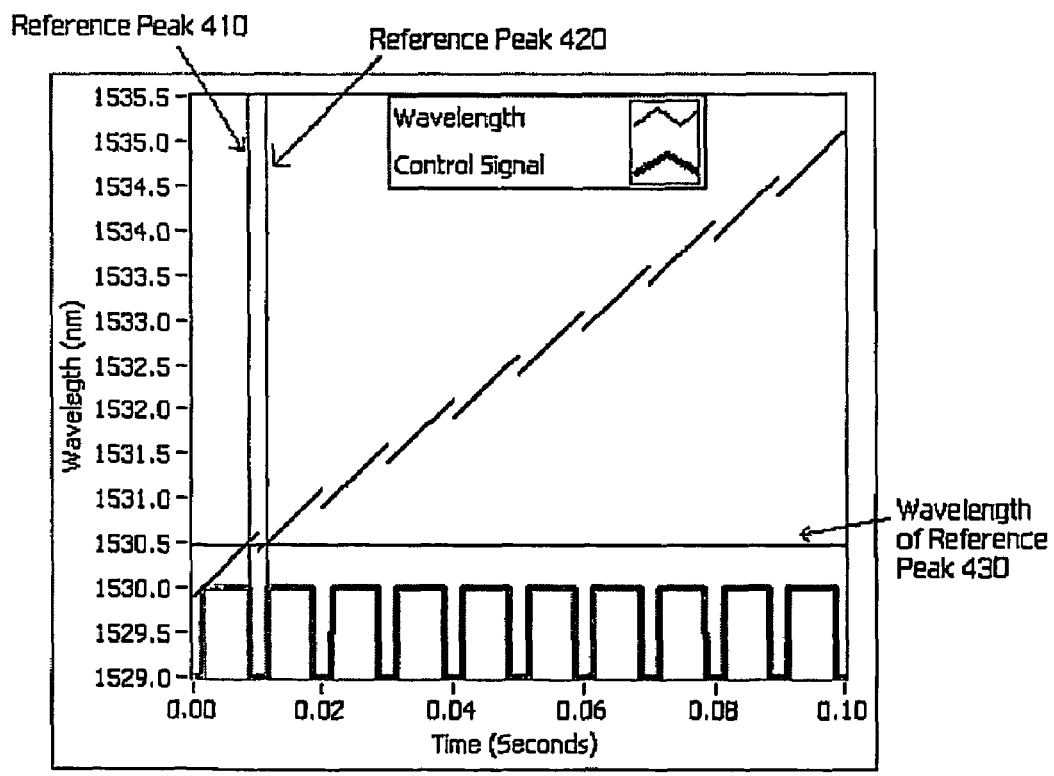
FIG. 6 is a plot of frequency vs. time for a system utilising the method of the present invention.

FIG. 6 shows a plot of Frequency vs. Time for the system with measurements only being taken when the control signal is asserted. The gaps in the response allow for the sweeping of the laser in regions where the control signal is not asserted and therefore not used. It will be appreciated that although there are breaks in between each of the sets of continuous regions that these breaks represent time delays and that the end point of one set and the start point of a second set are at the same wavelength (as could be seen from the intercept of both points against the Y-axis, line 430). It will be also appreciated that time can be allowed for the laser to reach thermal equilibrium between each continuously tunable region.

As such it will be appreciated that FIG. 6 represents a reference spectrum for the tunable laser 300, which can then be used for examination of the characteristics of the DUT 325. A linear continuous curve may be formed from extrapolation of the data provided in FIG. 6.

The wavelength reference used allows exact wavelength calibration of the sweep. This is significant as the output wavelength of the laser can change due to degradation, ambient temperature etc. An important property of this system is that as the laser degrades etc. the absolute wavelength of the laser can vary but the linearity of the sweep is constant. The rate of change of wavelength of the sweep can also vary but by the novel implementation defined in this patent the calculation of the wavelength at any time is not affected.

Figure 8:
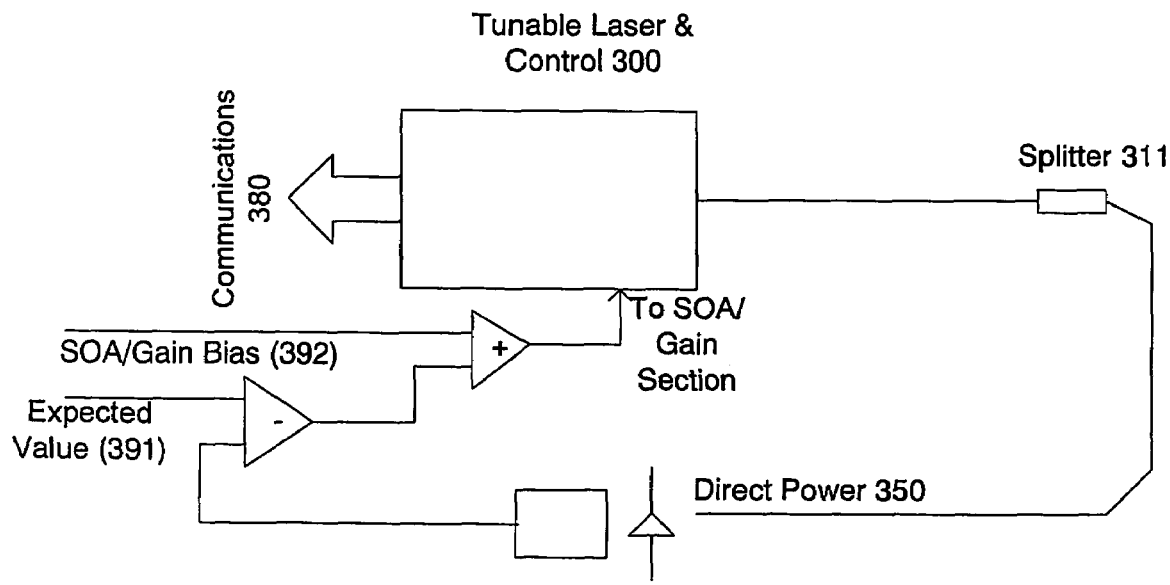
FIG. 8 is a schematic of a method for locking the output power of the laser

In addition provision is made for measurement of the output power of the laser using the direct power photodiode (350) shown if FIG. 2. This measurement is made to normalise the received power from the DUT to obtain a value independent of the output power of the laser by dividing the received DUT (360) power by the direct power measurement for every wavelength sampled. This means that while the wavelength sweep from the laser is linear, the output power does not have to be constant to achieve a good throughput figure for the DUT. Alternatively this can be achieved by controlling the output power of the laser so that it is constant during a wavelength sweep, or by actively locking the output power of the laser as shown in FIG. 8 using a section of the laser which controls the output power and the direct power photodiode measurement. This can be achieved similar to the locking scheme employed by PCT publication no. WO 03/023916.

The use of power levelling above also has the benefit of enabling the use of lower finesse etalons to achieve the same accuracy of stitching as the power at the end of one segment and the start of the second segment thus the resonance peaks will have the same characteristic.

A second embodiment can be described once again with reference to a three section DBR device.

Figure 9:
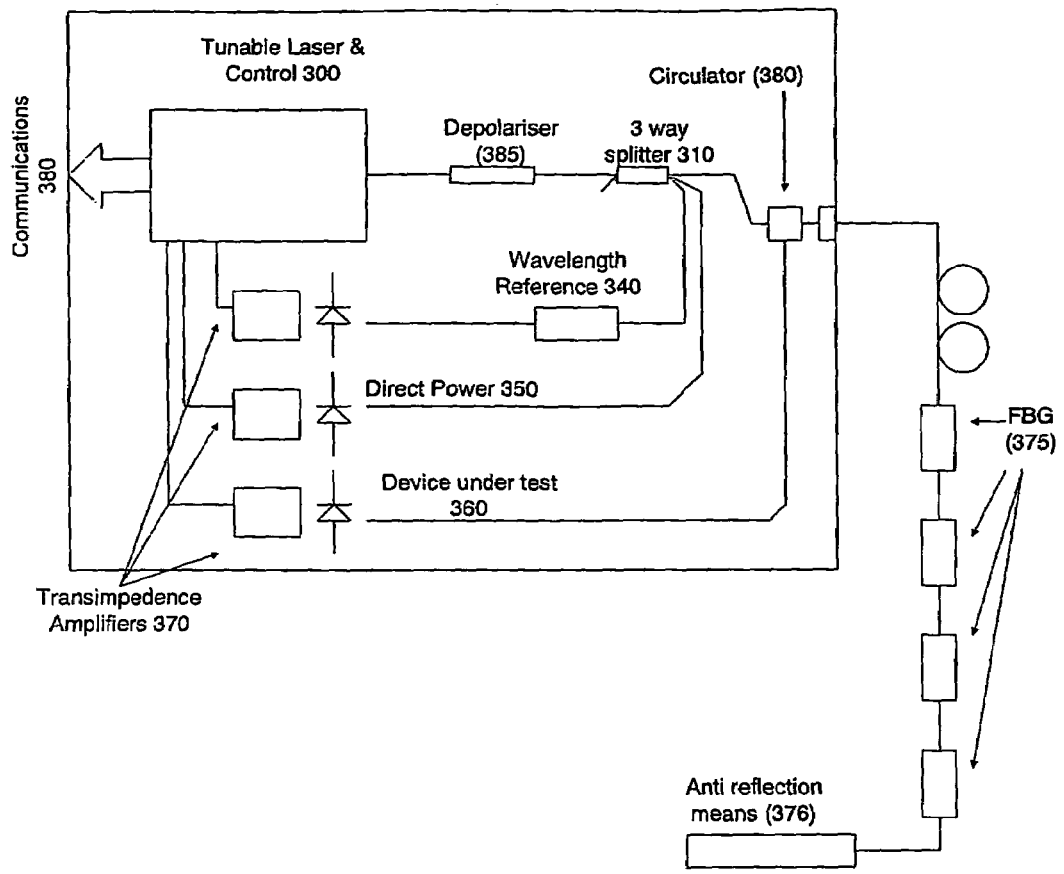
FIG. 9 shows a schematic of an embodiment of the system in an application to measure the reflection response of a network of fibre bragg gratings

In a further embodiment the system can be configured as in FIG. 9 where the reflection from a network of fibre bragg gratings (FBG) can be measured. Multiple FBGs can be measured where each FBG has a reflection spectra at a different wavelength. The system can similarly be used to measure FBGs in transmission as shown in FIG. 10.

Figure 10:
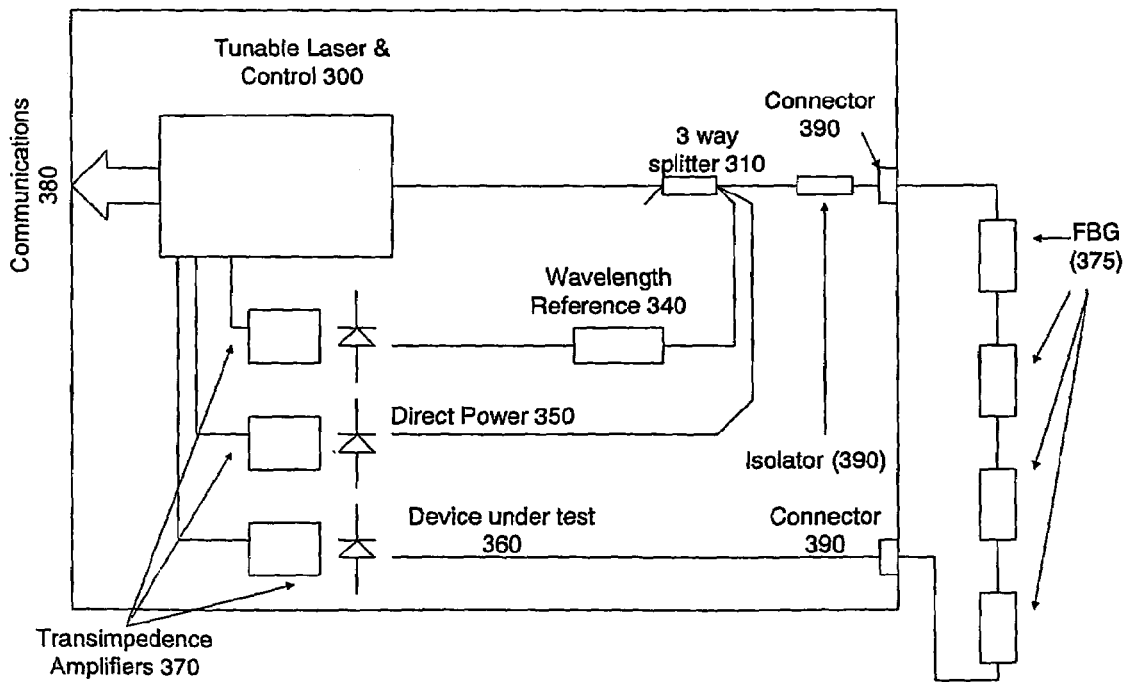
FIG. 10 shows a schematic of an embodiment of the system in an application to measure the transmission response of a network of FBGs.

It should also be noted that as shown in FIG. 9 and FIG. 10 an isolation means by use of a optical circulator or optical isolator may be added to the system (380) and (390) respectively.

It should also be noted that a depolariser can be added to the system as shown in FIG. 9 (385) to depolarise the output light of the laser. In many cases the response of the DUT is dependent on polarisation of the incident light and depolarising this light can improve repeatability and accuracy of the system.

In a further embodiment of the system the laser output can be split using a couple to multiple DUTs and a multiple receivers used to measure the response of each DUT. Thus simultaneous measurements can be made of multiple DUTs. Another alternative is to use an optical switch to switch between multiple DUTs and measure the DUTs in a sequential manner.

Again as can be seen from FIG. 3 a continuous tuning region is obtained by finding a line that crosses no mode boundaries. This can be accomplished in a number of ways such as in "Complete Wavelength Control of a GCSR Laser over EDFA Band" IEEE LEOS'99, San Francisco, November '99, T. Farrell et al. The simplest is to locate each of the mode boundaries using some appropriate type of filter and compute the equation of the line between them.

Once a series of these continuous sweeps has been identified, a set of continuous regions can be selected each of which overlap by a predetermined frequency such as 10 GHz and each of which starts and ends 10 GHz from one of the peaks of the high finesse etalon. The laser then sweeps through each of these continuous regions. Upon hitting the second etalon peak in a particular continuous sweep it de-asserts the control signal associated with the continuous regions of the sweep and starts sweeping along the beginning of the overlapping region of the next continuous region. When during this sweep it once again detects the peak of the etalon it will know it is at exactly the same frequency and can reassert the control signal thereby providing seamless continuity in the tuning with no gaps or overlaps in wavelength in the measurements.

The accuracy and performance of the tunable laser is dependent on the accuracy of the calibration. By calibrating the laser to high accuracy and achieving a linear wavelength sweep with respect to time this novel technique can deliver high speed and high accuracy not available with existing techniques technology.

If a sweeper with sub 0.1 pm accuracy is required over a typical 40 nm sweep range this results in 40,000 points that have to be set on the laser. For each of these points multiple currents have to be controlled to ensure linear tuning, good SMSR, line width and constant output power. This can result in a large amount of data, i.e. for a SG-DBR laser where 4 laser sections are controlled (Front reflector, Back reflector, Phase and Gain or SOA) the number of bytes of data in a lookup table is 40,000 different set points multiplied by 4 controlled sections by 2 bytes to store the set value=40,000× 4×2=320 Kbytes. While this is straightforward for a PC in an actual instrument this will rapidly become the bottleneck and the sweep speed will suffer. For example for a sweep speed of 100 ms, the data needs to be retrieved at 3.2 Mbytes/sec processed and set to the laser. The methodology of the present invention may be extended to provide a method of approximating the tuning of each section that allows for data minimisation and speed of sweep.

FIG. 4 shows the characteristic tuning of a segment of the laser. It will be noted that the other sections of the laser must be controlled to achieve this type of tuning. To get a good approximation of this curve a complex equation is required to fit, an example of which will be given as below.

An approximation that works well over most of the tuning rate is:

$Y = a + b/(c-x)$ where y is the output frequency of the laser and x is the phase current.

As this function requires a divide to calculate this takes significant time and reduces the overall speed of sweep possible. Use of a polynomial approximation can provide sufficient accuracy with enough coefficients to a given or required wavelength accuracy. Also reducing the segment size can greatly reduce the error of a low order polynomial fit. The advantage of using a polynomial fit is that this can be implemented by using a set of difference equations and result in a set of additions to be performed rather than time consuming multiplies or divides.

By using a polynomial which can be calculated as a set of additions this means that the speed of the calculations can be performed quickly and not effect the speed of the sweep. This means that the sweep speed can be limited by the physical properties of the laser instead of the supporting electronics.

It will be appreciated that the present invention provides a method for establishing a continuous tuning set from a discontinuous laser. Such a method of operating a tunable laser, as provided by the present invention provides a high accuracy sweeping tunable source by means of a wavelength reference. The method desirably provides for a calibration of a tunable laser in a manner that provides for continuously tunable segments between each known wavelength from the wavelength reference. As will be understood from the above mentioned exemplary embodiment, any gaps between known wavelengths of the wavelength reference are traversed by a single segment, and desirably each of the continuously tunable segments overlaps with the adjacent segments.

Figure 11:
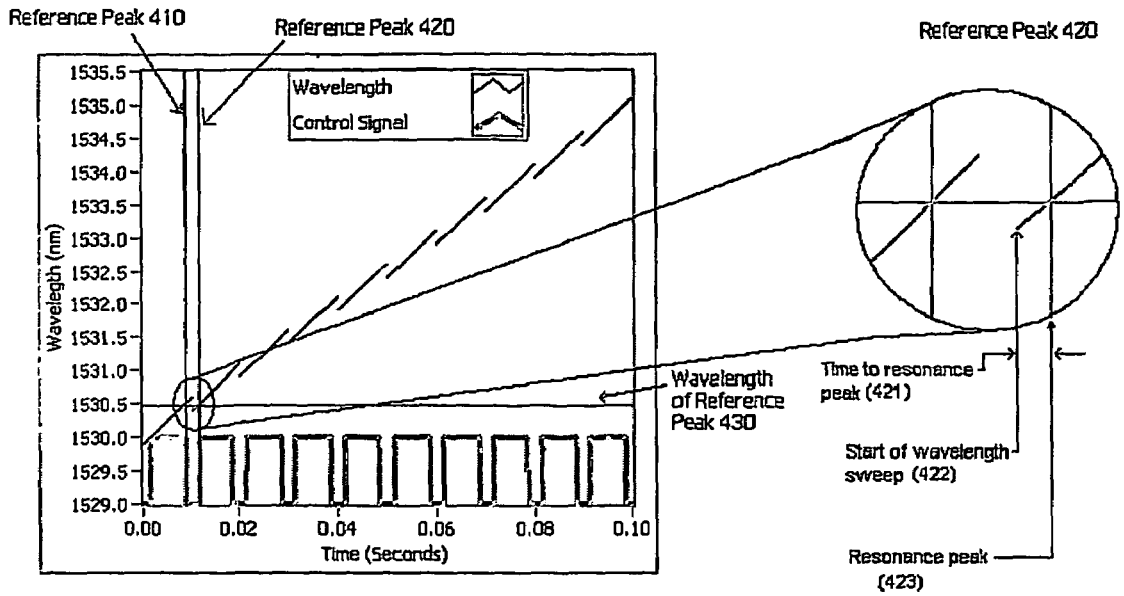
FIG. 11 plot displaying how the time from the start of a continuous wavelength sweep to a resonance peak can be measured.

By calibrating the tunable laser in a manner wherein the wavelength tuning is constant with time while in operation, the wavelength of the laser at any time can be calculated from the wavelength references at the time for the laser to tune between them The performance of the system can also be improved by accurately controlling the temperature of the laser and a novel means to do so is described below. This is performed as in FIG. 11 where a gas cell or other wavelength reference is used. First the time in a segment at which the resonance of the reference occurs is measured, secondly this is compared against an expected value. Thirdly the temperature of the laser is adjusted in a direction (either a slight increment or decrement) to bring the measured time to reference closer to the expected time. The direction of the temperature adjustment is dependent on the sign of the difference between the expected and measured time to resonance.

The method described above has the benefit of removing ambient temperature effects on the laser as the laser temperature is referenced on the wavelength reference rather than a thermistor. Typically the thermistor is effected slightly by ambient temperature as it is a small distance from the laser, but by using the technique outlined above this can be reduced significantly, typical values are +−5 GHz variation in 0 to 70 deg C. without wavelength referencing, improving to <1 GHz over 0 to 70 deg C.

It should be noted that the above method can be alternatively referenced by a measurement of ambient temperature and a known or pre-measured conversion from ambient temperature to set temperature be used to set the temperature of the laser. This technique will provide improvements but is not as accurate at using a wavelength reference.

Figure 7:
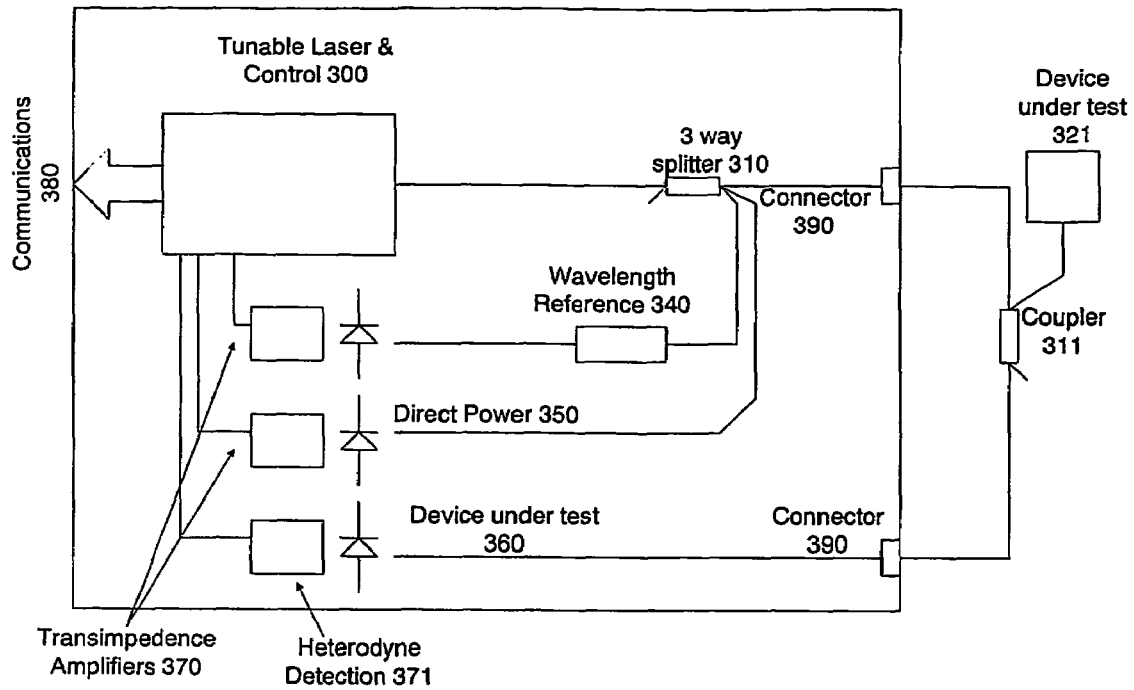
FIG. 7 is a schematic of a second application of the methodology of the present invention.

In a further embodiment, as shown in FIG. 7, the DUT can be an optical source and the system can be configured to measure the wavelength of the optical source as a wavelength meter, or perform as an optical spectrum analyser. This involves a heterodyne detection method 371 where the optical light from the tunable laser and the optical device under test are mixed (in coupler 311) and a beat signal generated. This beat signal is at a frequency of the difference between the two optical signals. By low pass filtering the photodiode detector a beat will only be present on the receiver when the frequency difference between the two optical signals in less than the bandwidth of the low pass filter. The heterodyne receiver performs the following actions 1. AC couple the photodiode response
2. Low Pass the photodiode response
3. Rectify the low passed output
4. Low pass the rectified output or integrate and dump.

With use of the correct bandwidths when the optical wavelength of the DUT and the tunable laser are within the required wavelength of each other a signal is received on the heterodyne receiver. As the wavelength of the tunable laser is known the wavelength of the DUT can be measured.

It will be noted that those skilled in the art that increased signal sensitivities can be achieved with the use of a polarisation controller on the DUT input and/or the use of a polarisation diversity receiver, for increasing the dynamic range of the proposed embodiment.

It will be appreciated that the present invention provides a method that enables the use of resonance peaks in a wavelength reference to define regions of continuous operation of a discontinuous laser device. By subdividing the operating region of the laser device into segments or regions of continuous operation the present invention provides for continuous operating regions in an extended sweep of the laser device. This has application in a number of different fields for example as an optical spectrum analyser or the like.

In another embodiment of the system the gain of the DUT can be actively controlled by the control electronics. As the system performs wavelength sweep by using a set of continuous wavelength segments, the gain for each region can be changed electronically for each segment while the laser is switching from one segment to the next. This has the benefit that wavelengths where the response from the DUT is small can be magnified by increasing the gain and hence improving the signal to noise for these responses, while large responses can be made with a corresponding gain and therefore the sensitivity of the receiver can be adjusted to suit the DUT.

Figure 12:
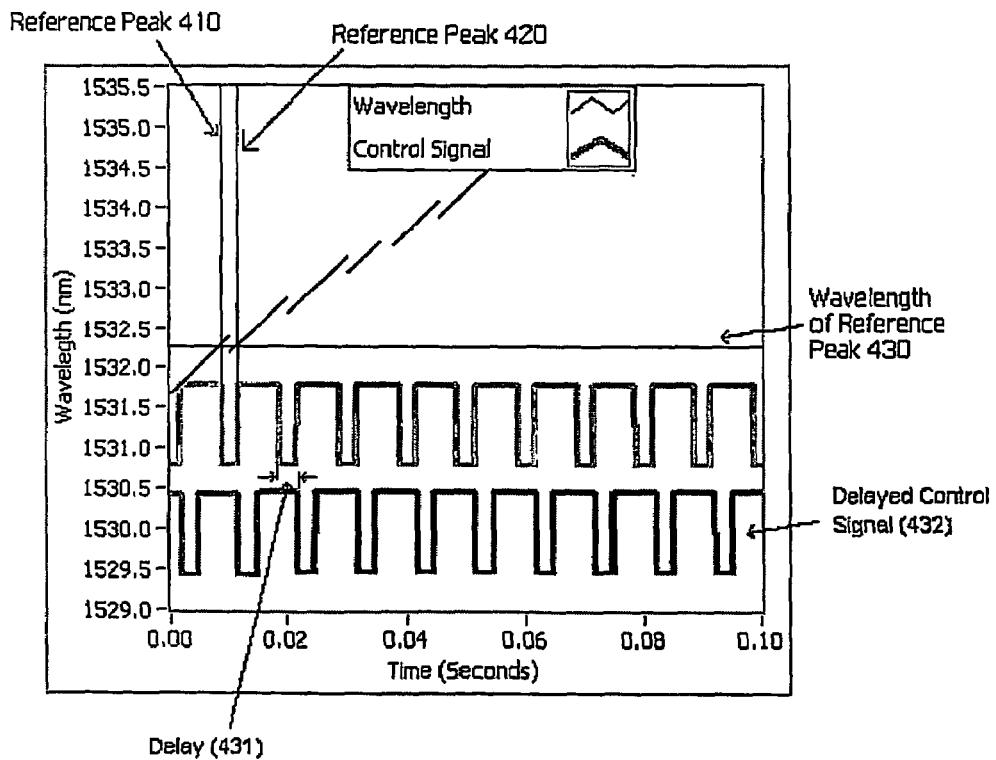
FIG. 12 is a graph similar to that of FIG. 6 where the a second control signal is generated by delaying the first control signal to implement a delay in the receiver sampling to compensate for propagation of light from the laser trough the DUT.

In a further embodiment a delay can be added between the time the reference resonance peaks occur and the sampling is performed on the DUT which is achieved by delaying the control signal (424) as shown in FIG. 12. This can be used to account for propagation delays in the fibre from the system to the DUT and back to the DUT receiver (360). These times can be calculated by the path length to the DUT or alternatively measured using an OTDR (Optical Time Domain Reflectometry) method. As with the gain control as above this delay can be implemented on a per segment basis to account for different propagation delays in different wavelength ranges.

The embodiments in the invention described with reference to the drawings comprise a computer apparatus and/or processes performed in a computer apparatus. However, the invention also extends to computer programs, particularly computer programs stored on or in a carrier adapted to bring the invention into practice. The program may be in the form of source code, object code, or a code intermediate source and object code, such as in partially compiled form or in any other form suitable for use in the implementation of the method according to the invention. The carrier may comprise a storage medium such as ROM, e.g. CD ROM, or magnetic recording medium, e.g. a floppy disk or hard disk. The carrier may be an electrical or optical signal which may be transmitted via an electrical or an optical cable or by radio or other means.

The invention is not limited to the embodiments hereinbefore described but may be varied in both construction and detail.

The words "comprises/comprising" and the words "having/including" when used herein with reference to the present invention are used to specify the presence of stated features, integers, steps or components but does not preclude the presence or addition of one or more other features, integers, steps, components or groups thereof.

The invention claimed is:

1. A method of providing a set of continuous tuning regions from a discontinuously tuned laser, the method comprising the steps of:
   providing a wavelength reference having at least first and second resonance peaks;
   sweeping the laser across a pre-determined wavelength range of the wavelength reference;
   defining, within the laser sweep, one or more regions of continuous tuning operation of the laser, each of the regions corresponding to a response of the laser between adjacent resonance peaks of the wavelength reference, wherein the regions of continuing tuning operation of the laser are defined by:
   calibrating the laser so as to provide a range of currents with no mode jumps;
   selecting continuous regions with a first frequency overlap that have a resonance peak of the wavelength reference from their beginnings and ends; and
   setting the currents whilst sweeping through those wavelengths so as to provide a smoothly transitioning wavelength sweep, wherein setting the currents is provided by filtering and/or shaping the currents; and
   assigning a frequency ($F_{meas}$) or wavelength ($\lambda_{meas}$) value to discrete points within the continuous region of operation of the laser device, the value being assigned by:
   measuring the time from the resonance peak at the beginning of the sweep to the measurement instant ($T_{meas}$),
   measuring the time required to sweep between adjacent resonance peaks ($T_{segment}$) and
   calculating the value by extracting a value for $T_{meas}$ from $T_{segment}$.

2. The method as claimed in claim 1 wherein the one or more regions of continuous tuning operation are adjacent to one another.

3. The method as claimed in claim 1 wherein the one or more regions of continuous tuning operation are displaced from one another across the pre-determined wavelength range.

4. The method as claimed in claim 1 further comprising the step of:
   stitching two or more regions to one another so as to form a usable tuning data set.

5. The method as claimed in claim 4 wherein the step of stitching the two or more regions to one another is effected by:
   a. creating a lookup table of regions that have continuous tuning over a first frequency region with a frequency overlap on either side with the previous and next continuous tuning regions,
   b. asserting a control signal to denote a continuous region when the first resonance peak is detected, c. de-asserting the control signal and jumping to the next continuous tuning region when the next resonance peak is found within this continuous tuning region, and d. repeating the above steps (b-c) until a sufficient range of wavelength has been swept.

6. The method as claimed in claim 1 wherein the value is a frequency value ($F_{meas}$) and the wavelength reference is an etalon, the frequency being calculated using the equation:

$$F_{meas} = FSR_{Etalon} * \frac{Tmeas}{Tsegment} + F_{SegmentStart},$$

where $FSR_{Etalon}$ is the free spectral range of the reference etalon and $F_{SegmentStart}$ is the absolute frequency of the first resonant etalon peak in the segment.

7. The method as claimed in claim 1 further including the step of using the laser device as a reference source for a second device.

8. The method as claimed in claim 1 including the step of measuring the output power of the laser and using this measurement to normalise the received DUT power.

9. The method as claimed in claim 1 further comprising the step of using the regions of continuous tuning operation to define the spectral characteristics of a second laser device.

10. The method as claimed in claim 1 further comprising the step of using the regions of continuous tuning operation to provide an optical spectrum analyser.

11. The method as claimed in claim 1 wherein the wavelength reference is provided by one or more of the following:
a fabry perot etalon,
a gas cell,
fibre bragg grating,
notch filter,
a reflective fabry perot etalon, and
optical filter.

12. The method as claimed in claim 1 wherein any portion of the resonance peak is used to determine the location of the resonance peak.

13. A method as claimed in claim 1 wherein the ambient temperature of the laser system is measured, based on this measurement the temperature of the laser is adjusted to keep the laser chip at a constant temperature.

14. A method as claimed in claim 1 where the temperature of the laser is controlled by the following steps:
a. Measuring the time to a resonance peak from the start of a continuous wavelength sweep
b. Comparing this time to an expected time
c. Adjusting the temperature of the laser based on the difference between the measured and expected times
d. Returning to step (a) and repeat if necessary.

15. A method as claimed in claim 5 wherein a delay is implemented between a control signal generated from the resonance peaks and a second control signal used to measure a photodiode.

16. A method as claimed in claim 5 wherein the control signal is used to assert/de-assert receiver sampling rate.

17. A system adapted to provide a set of continuous tuning regions from a discontinuously tuned laser, the system comprising:
a wavelength reference having at least first and second resonance peaks associated therewith;
a tunable laser;
means for sweeping the laser across a pre-determined wavelength range of the wavelength reference;
means for defining, within the laser sweep, one or more regions of continuous tuning operation of the laser, each of the regions corresponding to a response of the laser between adjacent resonance peaks of the wavelength reference, wherein the regions of continuing tuning operation of the laser are defined by:
means for calibrating the laser so as to provide a range of currents with no mode jumps;
means for selecting continuous regions with a first frequency overlap that have a resonance peak of the wavelength reference from their beginnings and ends; and
means for setting the currents whilst sweeping through those wavelengths so as to provide a smoothly transitioning wavelength sweep, wherein the means for setting the currents filter and/or shape the currents; and
means for assigning a frequency ($F_{meas}$) or wavelength ($\lambda_{meas}$) value to discrete points within the continuous region of operation of the laser device, the value being assigned by:
measuring the time from the resonance peak at the beginning of the sweep to the measurement instant ($T_{meas}$),
measuring the time required to sweep between adjacent resonance peaks ($T_{segment}$) and
calculating the value by extracting a value for $T_{meas}$ from $T_{segment}$.

* * * * *

UNITED STATES PATENT AND TRADEMARK OFFICE
CERTIFICATE OF CORRECTION

PATENT NO. : 7,649,917 B2  Page 1 of 1
APPLICATION NO. : 10/552967
DATED : January 19, 2010
INVENTOR(S) : Mullane et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 468 days.

Signed and Sealed this

Twenty-third Day of November, 2010

David J. Kappos
*Director of the United States Patent and Trademark Office*